United States Patent
Lee et al.

(10) Patent No.: US 8,619,428 B2
(45) Date of Patent: Dec. 31, 2013

(54) ELECTRONIC PACKAGE STRUCTURE

(75) Inventors: Han-Hsiang Lee, Taipei (TW);
Yi-Cheng Lin, Ping Tung County (TW);
Pei-Chun Hung, Taichung County (TW); Bau-Ru Lu, Chang Hua County (TW); Da-Jung Chen, Tao Yuan County (TW); Jeng-Jen Li, Tai Pei (TW)

(73) Assignee: Cyntec Co., Ltd., Hsin-chu (TW)

( * ) Notice: Subject to any disclaimer, the term of this patent is extended or adjusted under 35 U.S.C. 154(b) by 215 days.

(21) Appl. No.: 13/206,810

(22) Filed: Aug. 10, 2011

(65) Prior Publication Data

US 2012/0075808 A1  Mar. 29, 2012

(30) Foreign Application Priority Data

Sep. 28, 2010 (TW) ................. 99132712 A

(51) Int. Cl.
*H05K 7/20* (2006.01)

(52) U.S. Cl.
USPC ............... 361/720; 361/679.52; 361/679.54; 361/707; 361/712; 165/80.2; 165/104.33; 174/252; 174/260; 257/678; 257/712; 257/778

(58) Field of Classification Search
USPC .......... 361/679.46, 679.54, 704–712, 715, 361/719–724, 732, 748, 736, 740, 741, 361/792–795; 165/80.2, 80.3, 104.33, 185; 174/16.3, 250–267; 257/686, 687, 698, 257/697, 622, 762, 763, 773, 706–727, 133, 257/341, 343, 401, 778, 734, 737, 738
See application file for complete search history.

(56) References Cited

U.S. PATENT DOCUMENTS

| 4,218,701 | A  | * | 8/1980  | Shirasaki ................ 257/778 |
| 5,223,741 | A  | * | 6/1993  | Bechtel et al. ............ 257/678 |
| 5,285,352 | A  | * | 2/1994  | Pastore et al. ............ 361/707 |
| 5,398,160 | A  | * | 3/1995  | Umeda .................... 361/707 |
| 5,642,261 | A  | * | 6/1997  | Bond et al. ................ 361/704 |
| 5,942,797 | A  | * | 8/1999  | Terasawa ................. 257/723 |
| 7,026,664 | B2 | * | 4/2006  | Divakar et al. ............ 257/107 |
| 7,116,557 | B1 | * | 10/2006 | Raby et al. ............... 361/720 |
| 7,180,177 | B2 | * | 2/2007  | Guillet et al. ............. 257/712 |
| 7,361,844 | B2 | * | 4/2008  | Vinciarelli et al. ......... 174/260 |
| 7,741,158 | B2 | * | 6/2010  | Leung et al. .............. 438/122 |
| 8,253,026 | B2 | * | 8/2012  | Strauss et al. ............ 174/252 |
| 2005/0133698 | A1 | * | 6/2005 | Oniki et al. .............. 250/216 |
| 2008/0303124 | A1 |   | 12/2008 | Khan et al. |

FOREIGN PATENT DOCUMENTS

TW    I260756    11/2004

* cited by examiner

*Primary Examiner* — Michail V Datskovskiy
(74) *Attorney, Agent, or Firm* — Muncy, Geissler, Olds & Lowe, PLLC

(57) ABSTRACT

An electronic package structure is provided. The electronic package structure comprises a substrate, a first electronic element, and a second electronic element. The substrate includes a heat-dissipating plate and a circuit board disposed on the heat-dissipating plate. The first electronic element is disposed on the heat-dissipating plate and coupled to the circuit board. The second electronic element is disposed on the circuit board and coupled to the circuit board.

15 Claims, 4 Drawing Sheets

ELECTRONIC PACKAGE STRUCTURE

BACKGROUND OF THE INVENTION (a) Field of the Invention

The invention relates to an electronic package structure, particularly to an electronic package structure having a preferable heat distribution function.

(b) Description of the Related Art

FIG. 1 shows a conventional direct current to direct current (DC to DC) converter package structure. As shown in FIG. 1, the structure disclosed by U.S. Pat. No. 6,212,086 is a DC-to-DC converter package. The DC-to-DC converter package structure 100 comprises a circuit board 120, a copper substrate 110 and a plurality of electronic elements. The circuit board 120 is placed on the copper substrate 110 and thus the heat can be uniformly dissipated through the copper substrate 110 provided on the bottom of the device. The above electronic elements comprise a main transformer 130, an output inductor 140, synchronous rectifiers 150, output capacitors 160 and input capacitors 170 which are provided on the circuit board 120 and are electrically coupled to each other through the circuit layout inside the circuit board 120. An independent output connector is provided at the right-hand side of the circuit board 120 and is electrically coupled to the circuit board 120 through a flexible printed circuit board. A drawback of the conventional technique is that the heat produced by the electronic elements 130, 140, 150, 160 and 170 cannot be effectively conducted to the copper substrate 110 below because the circuit board 120 is not a preferable heat conductor. The circuit board 120 may contribute to the design of the circuit layout; however it is not propitious for the conduction of heat. In contrast, the copper substrate 110 may contribute to the conduction of heat; however it is not propitious for the design of the circuit layout. Accordingly, the person skilled in the art is actively developing a new substrate which has both of the two above advantages.

BRIEF SUMMARY OF THE INVENTION

One object of the invention is to provide an electronic package structure having a preferable heat distribution function, compared with the conventional package structure. One object of the invention is to provide an electronic package structure whose volume is small and into which the circuit and the electric elements is compacted by means of high density assembly. One object of the invention is to provide an electronic package structure having both of the advantages of the circuit board and the heat-dissipating plate. One object of the invention is to provide an electronic package structure which can uniformly dissipate heat.

According to one embodiment of the invention, an electronic package structure is provided. The electronic package structure comprises a substrate, a first electronic element, and a second electronic element. The substrate includes a heat-dissipating plate and a circuit board disposed on the heat-dissipating plate. The first electronic element is disposed on the heat-dissipating plate and coupled to the circuit board. The second electronic element is disposed on the circuit board and coupled to the circuit board.

In one embodiment, the substrate further comprises a plurality of conductive nodes. The circuit board has a circuit layout and defines an opening extending from the first surface of the circuit board to the second surface of the circuit board opposite the first surface. The heat-dissipating plate is disposed on the second surface of the circuit board, and the location of the heat-dissipating plate corresponds to that of the opening so that the heat-dissipating plate covers at least a part of the opening. The conductive nodes are disposed on the circuit board, coupled to the circuit layout, and used for being coupled to an external electronic device. The first electronic element is disposed in the opening and coupled to the circuit layout. The second electronic element is coupled to the circuit layout, and the amount of heat produced by the first electronic element is larger than that produced by the second electronic element.

In one embodiment, the second electronic element is disposed on the first surface of the circuit board, and the conductive nodes are disposed on the second surface of the circuit board.

In one embodiment, the substrate further includes a plurality of the thermal vias. Each thermal via comprises a through-hole and a heat-dissipating material. The through-hole extends from the first surface of the circuit board to the second surface of the circuit board. The heat-dissipating material is filled in the through-hole. The electronic package structure further comprises a third electronic element disposed on the first surface and coupled to the circuit layout. The amount of heat produced by the third electronic element is between the amount of heat produced by the first electronic element and the amount of heat produced by the second electronic element. The location of the third electronic element corresponds to that of the thermal vias so that the heat from the third electronic element is conducted from the first surface to the second surface through the heat-dissipating material.

In one embodiment, the electronic package structure further comprises a package layer. The package layer is disposed on the first surface of the circuit board and covers the first electronic element, the second electronic element, and the third electronic element.

In one embodiment, the electronic package structure further comprises at least a conductive wire. The first electronic element is coupled to the circuit board through the conductive wire.

In one embodiment, the heat-dissipating plate is a metal plate. It is preferred that the metal plate is a lead frame.

In one embodiment, the electronic package structure is a direct current to direct current converter package structure.

According to an embodiment of the present invention, a substrate of an electronic package structure includes a circuit board and a heat-dissipating plate so as to have both the advantages of using a circuit board as the substrate and using a heat-dissipating plate as the substrate. The advantage of using a circuit board is that the electronic package structure may have a larger number of conductive pins, while the advantage of using a heat-dissipating plate is that it may have a preferable heat distribution function. By this design, the heat from different electronic elements may be arranged to be dissipated through different heat-dissipating structures. This may effectively dissipate the heat from the electronic package structure 200 and prevent warpage of the electronic package structure 200 caused by locally over-heating and nonuniformly-heating.

Other objects and advantages of the invention can be better understood from the technical characteristics disclosed by the invention. In order to clarify the above mentioned and other objects and advantages of the invention, examples accompanying with figures are provided and described in details in the following.

DETAILED DESCRIPTION OF THE INVENTION

Figure 1:
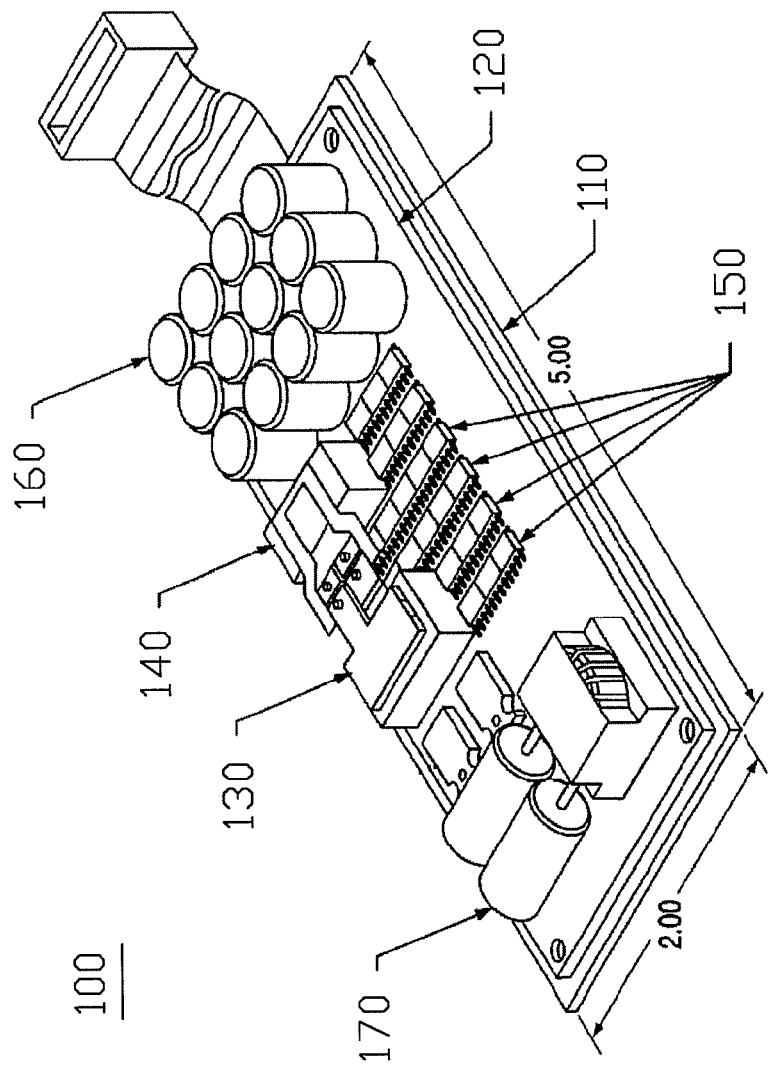
FIG. 1 shows a conventional direct current to direct current (DC to DC) converter package structure.
Figure 2:
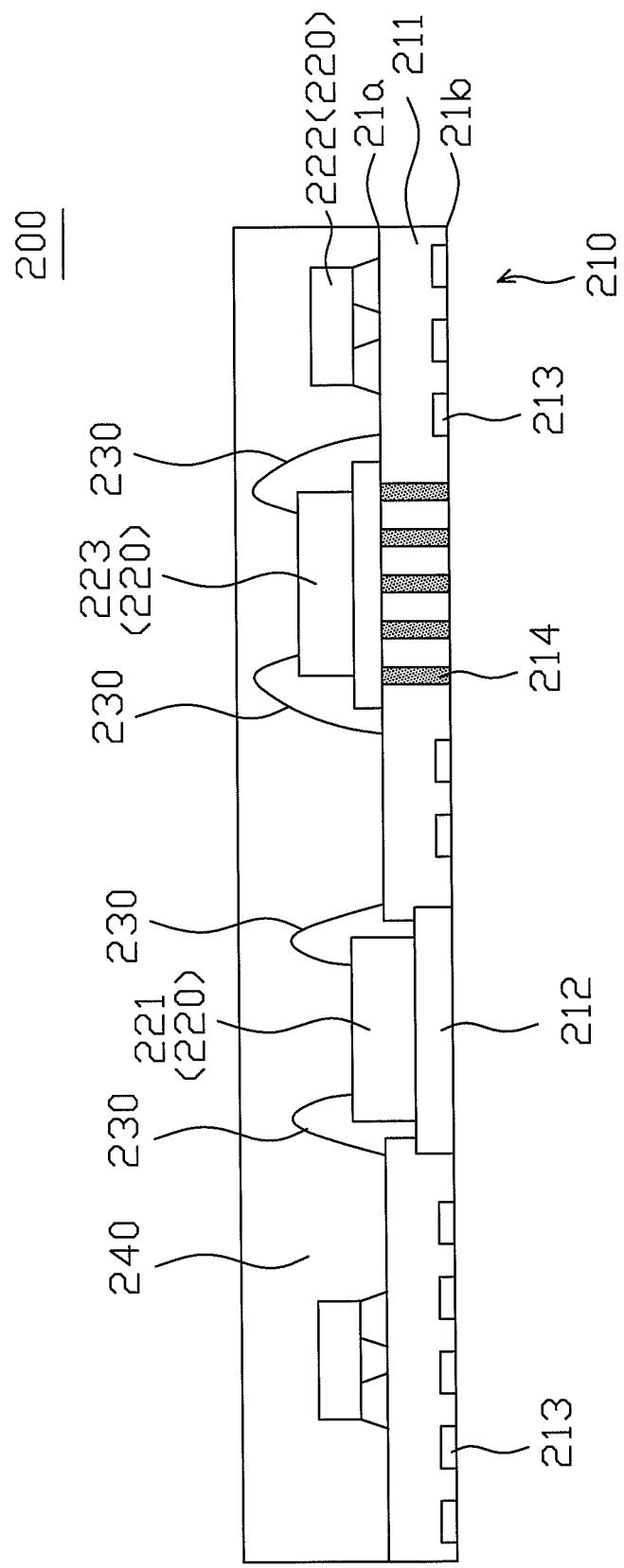
FIG. 2 shows a cross-sectional schematic diagram illustrating an electronic package structure according to one embodiment of the invention.
Figure 3A:
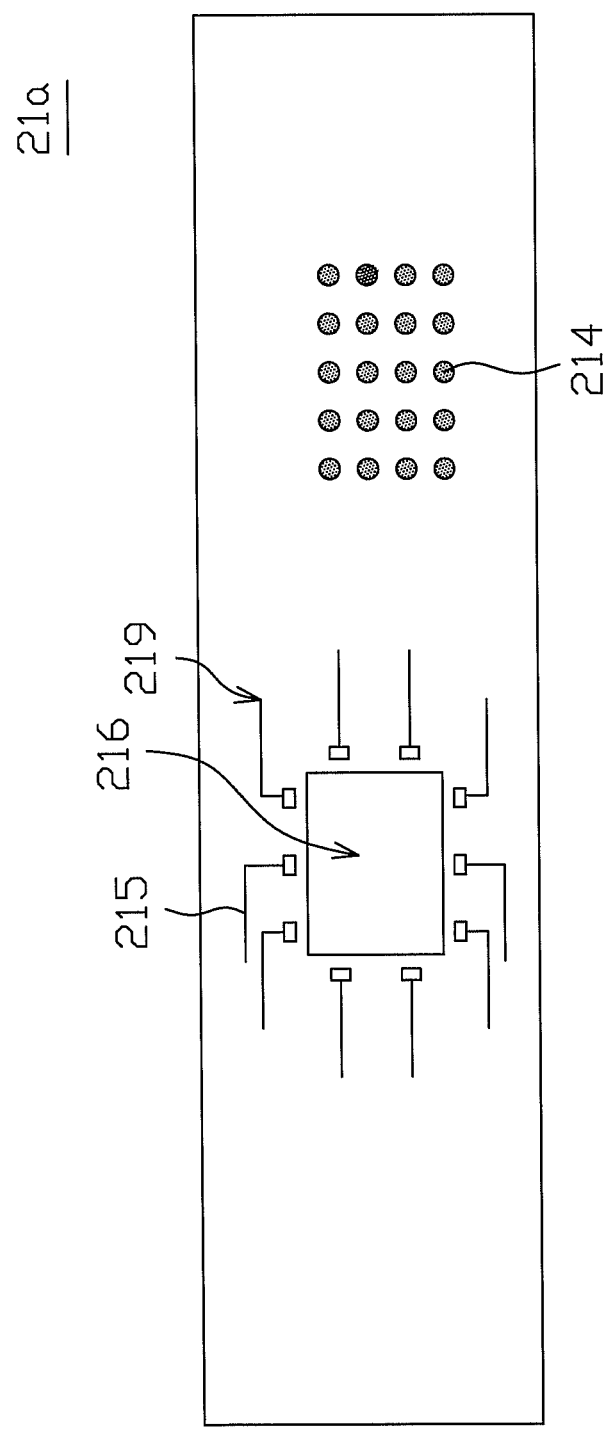
FIG. 3A shows a top view of a substrate of an electronic package structure according to an embodiment of the present invention.

FIG. 2 shows a cross-sectional schematic diagram illustrating an electronic package structure according to one embodiment of the invention. As shown in FIG. 2, the electronic package structure 200 includes a substrate 210, a plurality of electronic elements 220 and a plurality of conductive wires 230. The electronic elements 220 are disposed on the substrate 210 and are electrically coupled to a plurality of circuit lines 215 of a circuit layout 219 in the substrate 210 (as shown in FIG. 3A). In one embodiment, the electronic elements 220 include a first electronic element 221, a second electronic element 222, and a third electronic element 223. The amount of heat generated by the first electronic element 221 is larger than that generated by the third electronic element 223. The amount of heat generated by the third electronic element 223 is larger than that generated by the second electronic element 222. Specifically, the first electronic element 221 may be a power element, such as a chip, an integrated element, a metal oxide semiconductor field effect transistor (MOSFET), an insulated-gate bipolar transistor (IGBT), a diode, a main transformer and a synchronous rectifier, which is the element that produces a larger amount of heat. The second and third electronic elements 222 and 223 may be passive elements or microelectronic elements which produces a smaller amount of heat.

Figure 3B:
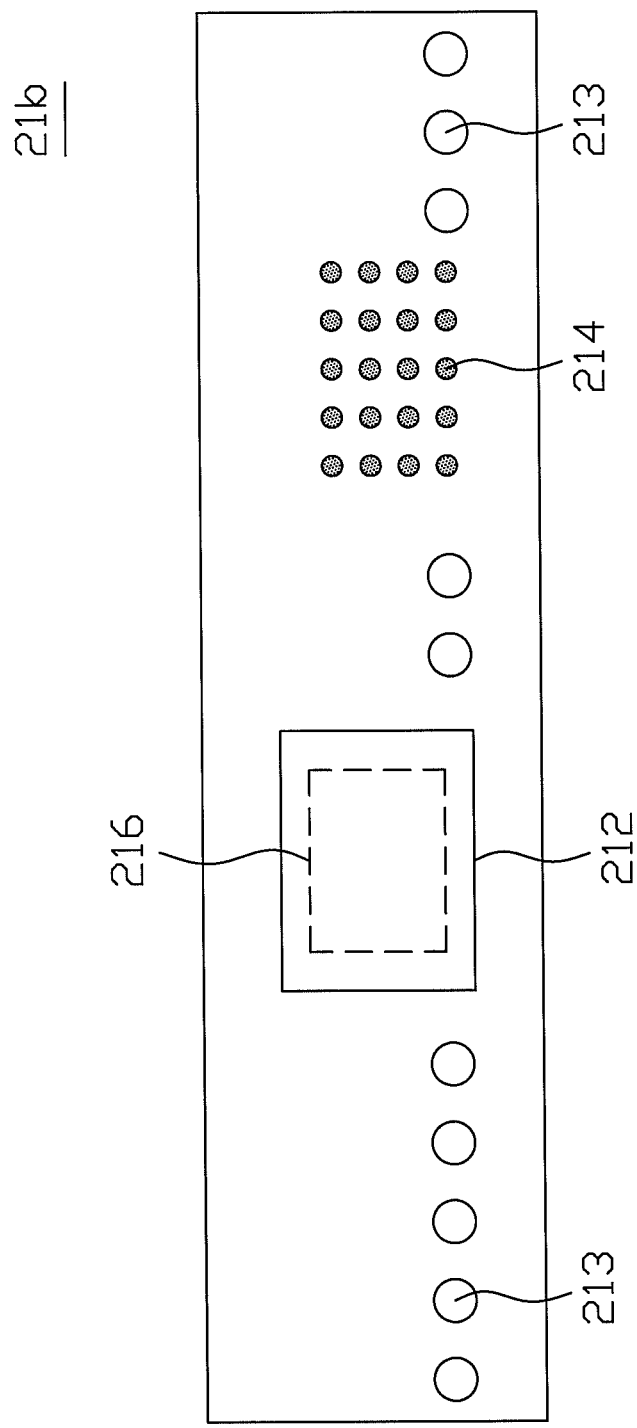
FIG. 3B shows a bottom view of a substrate of an electronic package structure according to an embodiment of the present invention.

FIG. 3A shows a top view of a substrate of an electronic package structure according to an embodiment of the present invention. FIG. 3B shows a bottom view of a substrate of an electronic package structure according to an embodiment of the present invention. As shown in FIGS. 2 and 3A, the substrate 210 includes a circuit board 211, a circuit layout 219 having a plurality of circuit lines 215 and a plurality of thermal vias 214. The circuit board 211 may be a Printed circuit board (PCB) defining an opening 216. The opening 216 extends from a top surface 21a of the circuit board 211 to a bottom surface 21b of the circuit board 211. A plurality of contact pads which encircle the opening 216 are formed at one ends of the circuit lines 215. The first electronic element 221 is disposed in the opening 216. The first electronic element 221 is also electrically coupled to the contact pads of the circuit lines 215 via the conductive wires 230 and thereby is electrically coupled to the circuit layout 219 in the circuit board 211. Each thermal via 214 is comprised of a through-hole, extending from the top surface 21a of the circuit board 211 to the bottom surface 21b of the circuit board 211, in which an heat-dissipating material is filled. In one embodiment, the location of the third electronic element 223 corresponds to that of the thermal via 214, and the third electronic element 223 is in contact with the heat-dissipating material in the thermal vias 214. As a result, the heat from the third electronic element 223 may be conducted to the bottom surface 21b of the circuit board 211 through the thermal vias 214, and thereby is dissipated to the external environment.

As shown in FIGS. 2 and 3B, the circuit board 210 further includes a plurality of conductive nodes 213 and a heat-dissipating plate 212. The conductive nodes 213 are disposed on the bottom surface 21b of the circuit board 211. The conductive nodes 213 are coupled to the circuit layout 219 having a plurality of circuit lines 215 in the circuit board 211 and are used to be coupled to an external electronic device. By this way the electronic elements 220 of the electronic package structure 200 may be coupled to the external electronic device. In one embodiment, the conductive nodes 213 are formed by exposing a metal layer on the bottom surface 213. Since the conductive nodes 213 used for being coupled to an external device may be formed by using the manufacturing process of print circuit board, the electronic package structure 200 according to this embodiment can have relatively larger number of the conductive nodes 213 in a relative small volume, compared with the conventional electronic package structure which is coupled to an external electronic device through a lead frame.

The heat-dissipating plate 212 may be a metal plate or an nonmetal plate with heat dissipation efficiency better than that of the circuit board 211 or the thermal vias 214. In one embodiment, the heat-dissipating plate 212 may be a lead frame. The heat-dissipating plate 212 is disposed on the bottom surface 21b of the circuit board 211. The location of the heat-dissipating plate 212 corresponds to that of the opening 216. In one embodiment, the heat-dissipating plate 212 may be disposed on the bottom surface 21b of the circuit board 211 by pressing or laminating methods. In one embodiment, the heat-dissipating plate 212 is fitted within the circuit board 211 so that the heat-dissipating plate 212 does not protrude through the bottom surface 21b of the circuit board 211. By this way the bottom surface 21b may be configured to be a flat surface, but the invention is not limited to this. If the bottom surface 21b is flat, the electronic package structure 200 may be assembled with an external electronic device in a way that the conductive nodes 213 and the heat-dissipating plate 212 are all in contact with the corresponding conductive nodes and the corresponding heat-dissipating member of the external electronic device. In one embodiment, the heat-dissipating plate 212 is disposed on the bottom surface 21b of the circuit board 211 by pressing and laminating methods and protrudes from the bottom surface 21b. Since the first electronic element 221 producing the largest amount of heat, among the electronic elements, is arranged on the heat-dissipating plate 212 disposed on the bottom surface 21b of the circuit board 211, the heat from the first electronic element 221, therefore, may be dissipated to the external environment not only through the top surface 21a of the circuit board 211 but also through the bottom surface 21b of the heat-dissipating plate 212.

In one embodiment, the electronic package structure 200 may be the one which has small volume and into which the circuit and the electric elements is compacted by means of high density assembly. The electronic package structure 200 according to this embodiment may further comprise a package layer 240 disposed on the top surface 21a of the circuit board 211. The package layer 240 covers the electronic elements 220 including the first electronic element 221, the second electronic element 222, and the third electronic element 223. In this embodiment, the package layer 240 may prevent the electronic elements 220 from being in contact with each other, and may also strengthen the electronic package structure 200 so that the electronic elements 220 would not be easily broken away from the circuit board 211. As a result, the electronic package structure 200 is less likely to be damaged. In addition, the package layer 240 may also prevent erosion of the electronic elements 220 caused by moisture.

However, the heat from the electronic elements 220 is less likely be dissipated because of provision of the package layer 240, and it is not sufficient that the heat from the first electronic element 221, which produces the largest amount of heat, is dissipated only through the circuit board 211 and the thermal vias 214 thereon. In an embodiment of the present invention, the first electronic element 221 producing the largest amount of heat among the electronic elements is arranged on the heat-dissipating plate 212 which is disposed on the bottom surface 21b of the circuit board 211. Since the bottom side of the heat-dissipating plate 212 is not covered by the package layer 214 and is exposed to the external environment, the heat-dissipating plate 212 can effectively conduct the heat from the first electronic element 221 to the external environment. In addition, the third electronic element 223 producing the second largest amount of heat among the electronic elements may be in contact with the thermal vias 214 so that the heat from the third electronic element 223 may be conducted through the thermal vias 214. By this design, the heat from different electronic elements may be arranged to be dissipated through different heat-dissipating structures. This may effectively dissipate the heat from the electronic package structure 200 and prevent warpage of the electronic package structure 200 caused by locally over-heating and nonuniformly-heating.

Although the present invention has been fully described by the above embodiments, the embodiments should not constitute the limitation of the scope of the invention. Various modifications or changes can be made by those who are skilled in the art without deviating from the spirit of the invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. An electronic package structure comprising:
    a substrate including a heat-dissipating plate and a circuit board partially covering the heat-dissipating plate;
    a first electronic element disposed on the heat-dissipating plate and coupled to the circuit board; and
    a second electronic element disposed on the circuit board and coupled to the circuit board,
    wherein the substrate further comprises a plurality of conductive nodes,
    the circuit board has a circuit layout and defines an opening extending from the first surface of the circuit board to the second surface of the circuit board opposite the first surface,
    the heat-dissipating plate is disposed on the second surface of the circuit board, and the location of the heat-dissipating plate corresponds to that of the opening so that the heat-dissipating plate covers at least a part of the opening,
    the conductive nodes are disposed on the circuit board, coupled to the circuit layout, and used for being coupled to an external electronic device,
    the first electronic element is disposed in the opening and coupled to the circuit layout, and
    the second electronic element is coupled to the circuit layout, wherein the amount of heat produced by the first electronic element is larger than the amount of heat produced by the second electronic element, and
    wherein the second electronic element is disposed on the first surface of the circuit board, and the conductive nodes are disposed on the second surface of the circuit board, and
    wherein the substrate further includes a plurality of the thermal vias, each thermal via comprising:
    a through-hole extending from the first surface of the circuit board to the second surface of the circuit board; and
    a heat-dissipating material being filled in the through-hole, and
    the electronic package structure further comprises a third electronic element disposed on the first surface and coupled to the circuit layout, wherein
    the amount of heat produced by the third electronic element is between the amount of heat produced by the first electronic element and the amount of heat produced by the second electronic element and,
    the location of the third electronic element corresponds to that of the thermal vias so that the heat from the third electronic element is conducted from the first surface to the second surface through the heat-dissipating material.

2. The electronic package structure according to claim 1 further comprising a package layer disposed on the first surface of the circuit board and covering the first electronic element and second electronic element.

3. The electronic package structure according to claim 1 further comprising a package layer disposed on the first surface of the circuit board and covering the first electronic element, the second electronic element, and the third electronic element.

4. The electronic package structure according to claim 1 further comprising at least a conductive wire, wherein the first electronic element is coupled to the circuit board through the conductive wire.

5. The electronic package structure according to claim 1, wherein the heat-dissipating plate is a metal plate.

6. The electronic package structure according to claim 5, wherein the metal plate comprises a lead frame.

7. The electronic package structure according to claim 1, wherein the heat-dissipating plate is fitted within the circuit board.

8. The electronic package structure according to claim 1, wherein the electronic package structure is a direct current to direct current converter package structure.

9. An electronic package structure comprising:
    a substrate including a heat-dissipating plate and a circuit board partially covering the heat-dissipating plate, wherein the circuit board is a printed circuit board;
    a first electronic element disposed on the heat-dissipating plate and coupled to the circuit board; and
    a second electronic element disposed on the circuit board and coupled to the circuit board,
    wherein, the printed circuit board has a circuit layout and a plurality of conductive nodes, and the printed circuit board defines an opening extending from the first surface of the printed circuit board to the second surface of the printed circuit board opposite the first surface,
    the heat-dissipating plate is disposed on the second surface of the printed circuit board, and the location of the heat-dissipating plate corresponds to that of the opening so that the heat-dissipating plate covers at least a part of the opening,
    the conductive nodes are coupled to the circuit layout and adapted for being coupled to an external electronic device,
    the first electronic element is disposed in the opening and coupled to the circuit layout, and
    the second electronic element is coupled to the printed circuit layout, wherein the amount of heat produced by the first electronic element is larger than the amount of heat produced by the second electronic element, and wherein the heat-dissipating plate is fitted within the printed circuit board so that the lead-frame heat-dissipating plate does not protrude through the second surface of the printed circuit board.

10. The electronic package structure according to claim 9, wherein the second electronic element is disposed on the first surface of the printed circuit board, and the conductive nodes are disposed on the second surface of the printed circuit board.

11. The electronic package structure according to claim 10 further comprising a package layer disposed on the first surface of the printed circuit board and covering the first electronic element and second electronic element.

12. The electronic package structure according to claim 11, wherein the second surface is configured to be a flat surface.

13. The electronic package structure according to claim 12, wherein the conductive nodes are formed by exposing a part of a metal layer of the printed circuit board on the second surface.

14. An electronic package structure of a direct current to direct current converter, the electronic package structure comprising:
 a substrate including:
  a printed circuit board having a circuit layout and a plurality of conductive nodes, wherein
   the conductive nodes are coupled to the circuit layout and adapted for being coupled to an external electronic device, and
   the printed circuit board defines an opening extending from a first surface of the printed circuit board to a second surface of the printed circuit board opposite the first surface; and
  a heat-dissipating plate disposed on the second surface and fitted within the printed circuit board so that the heat-dissipating plate does not protrude through the second surface of the printed circuit board, wherein and the location of the heat-dissipating plate corresponds to that of the opening so that the heat-dissipating plate covers at least a part of the opening;
 a first electronic element disposed on the heat-dissipating plate, located in the opening and coupled to the circuit layout of the printed circuit board; and
 a second electronic element disposed on the printed circuit board and coupled to the circuit layout of the circuit board, wherein the amount of heat produced by the first electronic element is larger than the amount of heat produced by the second electronic element.

15. The electronic package structure of a direct current to direct current converter according to claim 14 further comprising a package layer, wherein
 the second electronic element is disposed on the first surface of the printed circuit board, and the conductive nodes are disposed on the second surface of the printed circuit board;
 the package layer is disposed on the first surface of the printed circuit board and covers the first electronic element and second electronic element.

* * * * *